United States Patent
Nagano et al.

(10) Patent No.: US 6,847,074 B2
(45) Date of Patent: Jan. 25, 2005

(54) SEMICONDUCTOR MEMORY DEVICE

(75) Inventors: Yoshihisa Nagano, Suita (JP); Tooru Nasu, Kyoto (JP); Shinichiro Hayashi, Takatsuki (JP); Eiji Fujii, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 590 days.

(21) Appl. No.: 09/785,502

(22) Filed: Feb. 20, 2001

(65) Prior Publication Data

US 2001/0015451 A1 Aug. 23, 2001

(30) Foreign Application Priority Data

Feb. 22, 2000 (JP) ........................................ 2000-043928

(51) Int. Cl.⁷ .............................................. H01L 29/72
(52) U.S. Cl. ..................................... 257/296; 257/295
(58) Field of Search ................................. 257/295, 296

(56) References Cited

U.S. PATENT DOCUMENTS

| | | | | |
|---|---|---|---|---|
| 5,773,314 A | * | 6/1998 | Jiang et al. | 257/296 |
| 5,854,104 A | * | 12/1998 | Onishi et al. | 257/296 |
| 6,078,072 A | * | 6/2000 | Okudaira et al. | 257/295 |
| 6,194,758 B1 | | 2/2001 | Tanaka et al. | |
| 6,229,166 B1 | * | 5/2001 | Kim et al. | 257/295 |
| 2001/0001211 A1 | | 5/2001 | Tanaka et al. | |

FOREIGN PATENT DOCUMENTS

CN    1221220 A    6/1999

* cited by examiner

Primary Examiner—Edward Wojciechowicz
(74) Attorney, Agent, or Firm—Donald R. Studebaker; Nixon Peabody, LLP

(57) ABSTRACT

A semiconductor memory device according to the present invention includes a memory cell capacitor for storing data thereon. The capacitor is made up of a first electrode connected to a contact plug, a second electrode and a capacitive insulating film interposed between the first and second electrodes. The first electrode includes a first barrier film in contact with the contact plug and a second barrier film, which is formed on the first barrier film and prevents the diffusion of oxygen. The second barrier film covers the upper and side faces of the first barrier film.

8 Claims, 8 Drawing Sheets

Thickness of the oxygen barrier film(nm)
(IrO2 film is used)

SEMICONDUCTOR MEMORY DEVICE

BACKGROUND OF THE INVENTION

The present invention relates to a semiconductor memory device, and more particularly relates to improving the reliability of a semiconductor memory device.

In recent years, as the digital technology is further developed, the performance of electronic units has been enhanced in order to process an even greater amount of data at a time. For that purpose, the number of semiconductor devices integrated on a chip for use in any electronic unit is rapidly increasing.

In a DRAM, a silicon dioxide film or a silicon nitride film has been used as a capacitive insulating film for a memory cell capacitor. However, to further increase the number of DRAMs integrated on a chip, a technique of using a high-dielectric-constant film as a capacitive insulating film for a memory cell capacitor has been widely researched and developed. Furthermore, to implement a nonvolatile RAM capable of performing high-speed write and read operations at a low voltage applied, a technique of using a ferroelectric film, exhibiting spontaneous polarization, as a capacitive insulating film for a memory cell capacitor has been vigorously researched and developed.

A planar memory cell has been used for a known semiconductor memory device. However, for a semiconductor memory device in which a high-dielectric-constant or ferroelectric film is formed as a capacitive insulating film for a memory cell capacitor, a stacked memory cell is used in order to realize a densely integrated memory operating at high speeds on the order of megabits.

Hereinafter, a known semiconductor memory device will be described with reference to the drawings.

FIG. 7 is a cross-sectional view illustrating a memory cell 100 for a semiconductor memory device disclosed in Japanese Laid-Open Publication No. 11-3977. As shown in FIG. 7, the memory cell 100 is implemented by integrating an MIS transistor 101 and a memory cell capacitor 102 together on a substrate. Source and drain regions 103a and 103b and a gate electrode 104 are formed around a semiconductor substrate, thus making up the MIS transistor '101. Further, a passivation film 105 is formed over the substrate. The memory cell capacitor 102 includes lower and upper electrodes 106 and 108 and a ferroelectric film 107 interposed between the electrodes 106 and 108. The lower electrode 106 is made up of Ti film 106a, oxygen barrier film 106b and Pt film (not shown) that are stacked in this order. The MIS transistor 101 and memory cell capacitor 102 are connected together via a contact plug 109 that passes through the passivation film 105 to reach the drain region 103b and to make electrical contact with the lower electrode 106.

However, in the known memory device, the contact plug 109 cannot make good contact with the lower electrode 106 in the memory cell capacitor 102.

SUMMARY OF THE INVENTION

It is therefore an object of the present invention to provide a highly reliable semiconductor memory device.

An inventive semiconductor memory device includes a memory cell capacitor for storing data thereon. The capacitor is made up of a first electrode or lower electrode connected to a contact plug, a second electrode or upper electrode and a capacitive insulating film interposed between the first and second electrodes. The first electrode includes a first barrier film or first film of the lower electrode in contact with the contact plug and a second barrier film or second film of the lower electrode, which is formed on the first barrier film and prevents the diffusion of oxygen. The second barrier film covers the upper and side faces of the first barrier film.

In the inventive semiconductor memory device, the first barrier film in the first electrode is covered completely with the second barrier film that can prevent the diffusion of oxygen. Accordingly, where the capacitive insulating film is formed by oxidation, it is possible to suppress the diffusion of oxygen into the first barrier film. As a result, a contact failure resulting from the oxidation of the contact plug can be prevented.

The first barrier film preferably includes a film that prevents a constituent element of the contact plug from diffusing into the capacitive insulating film.

In such an embodiment, the degradation in property of the capacitive insulating film can be prevented.

The first barrier film may include a film selected from the group consisting of TiN, TiAlN, TiSiN, TaN, TaSiN and TaAlN films.

The first barrier film may have upper and lower films and the lower film may be made of Ti or Ta.

The second barrier film may include an Ir or $IrO_2$ film.

Another inventive semiconductor memory device includes a memory cell capacitor for storing data thereon. The capacitor is made up of a first electrode connected to a contact plug, a second electrode and a capacitive insulating film interposed between the first and second electrodes. The first electrode includes a first barrier film in contact with the contact plug, a second barrier film covering the upper surface of the first barrier film and a third barrier film or third film of the lower electrode covering the side faces of the first barrier film. The second and third barrier films prevent the diffusion of oxygen.

In the inventive semiconductor memory device, the upper surface of the first barrier film in the first electrode is covered with the second barrier film that can prevent the diffusion of oxygen. And the side faces of the first barrier film is covered completely with the third barrier film that can also prevent the diffusion of oxygen. Accordingly, where the capacitive insulating film is formed by oxidation, the diffusion of oxygen into the first barrier film can be suppressed. As a result, it is possible to prevent a contact failure resulting from the oxidation of the contact plug.

The first barrier film preferably includes a film that prevents a constituent element of the contact plug from diffusing into the capacitive insulating film.

The first barrier film may include a film selected from the group consisting of TiN, TiAlN, TiSiN, TaN, TaSiN and TaAlN films.

The first barrier film may have upper and lower films and the lower film may be made of Ti or Ta.

Each of the second and third barrier films may include an Ir or $IrO_2$ film.

DESCRIPTION OF THE PREFERRED EMBODIMENTS

Figure 8:
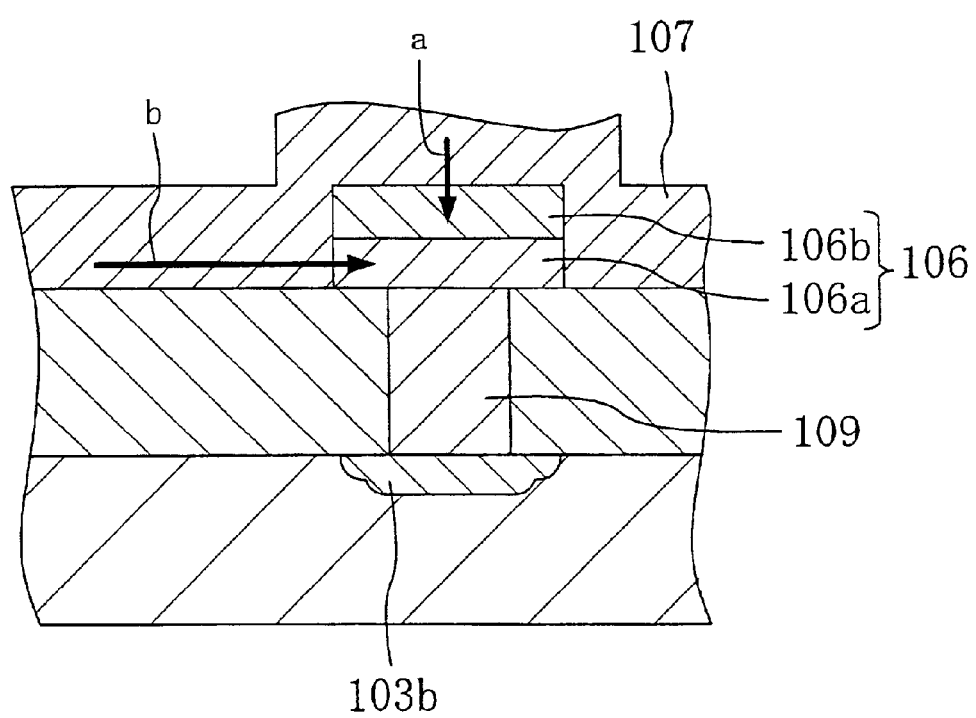
FIG. 8 is a cross-sectional view illustrating how a contact failure occurs in the known memory device.

Hereinafter, it will be described with reference to FIG. 8 exactly what is the problem of the known semiconductor memory device.

When the memory cell capacitor 102 is formed, the lower electrode 106 is formed over the contact plug 109 and then the ferroelectric film 107 is deposited thereon. In the process of forming the ferroelectric film 107, an annealing process is performed at a temperature between 650° C. and 800° C. within an oxygen ambient to grow ferroelectric crystals. In this case, as shown in FIG. 8, oxygen atoms diffuse into the lower electrode 106 downward (as indicated by arrow a in FIG. 8) and horizontally (as indicated by arrow b in FIG. 8). The downward (arrow a) diffusion of oxygen into the lower electrode 106 can be prevented by the oxygen barrier film 106b in the upper electrode 106. However, it is impossible to prevent the horizontal (arrow b) diffusion of oxygen into the lower electrode 106. This is because the Ti film 106a is easily oxidized and its side faces are in contact with the ferroelectric film 107. Accordingly, oxygen diffuses into the Ti film 106a through the side faces thereof. The diffused oxygen atoms also oxidize the surface of the contact plug 109. As a result of the surface oxidation of the contact plug 109, the contact plug 109 cannot make good contact with the lower electrode 106.

We realized our invention as the following embodiments based on these findings. Hereinafter, the embodiments of the present invention will be described with reference to the accompanying drawings. It should be noted that any component commonly used for the following embodiments is identified by the same reference numeral for the sake of simplicity.

Embodiment 1

Figure 1:
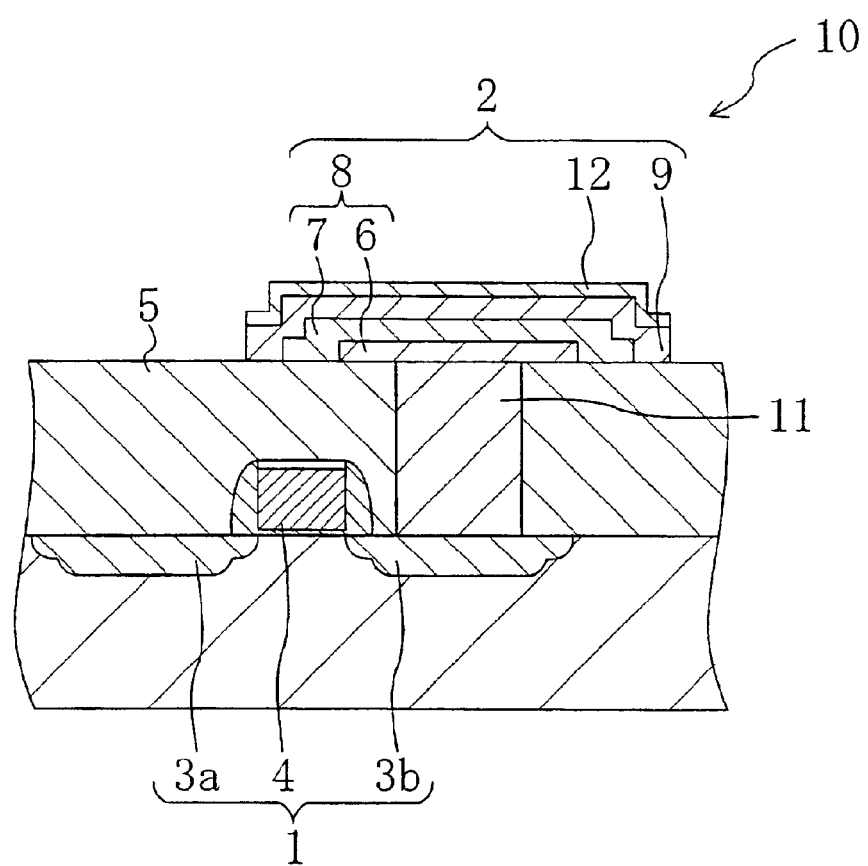
FIG. 1 is a cross-sectional view illustrating a memory cell for a semiconductor memory device according to a first embodiment of the present invention.

FIG. 1 is a cross-sectional view illustrating a memory cell for a semiconductor memory device according to a first embodiment of the present invention.

As shown in FIG. 1, a memory cell 10 is implemented by integrating an MIS transistor 1 and a memory cell capacitor 2 together on a substrate. Source and drain regions 3a and 3b and a gate electrode 4 are formed around a semiconductor substrate, thus making up the MIS transistor 1. Further, a passivation film 5 is deposited over the substrate.

The memory cell capacitor 2 is made up of lower and upper electrodes 8 and 12 and a capacitive insulating film 9 interposed between the electrodes 8 and 12. The lower electrode 8 consists of first and second barrier films or first and second films of the lower electrode 6 and 7.

The first barrier film or first film of the lower electrode 6 has a multilayer structure including Ti, TiAlN and Ir films stacked in this order. The Ir, TiAlN and Ti films have thicknesses of 100 nm, 40 nm and 20 nm, respectively.

The second barrier film or second film of the lower electrode 7 has a multilayer structure including $IrO_2$ and Pt films stacked in this order. And the second barrier film 7 is deposited so as to cover the first barrier film 6 completely. The Pt and $IrO_2$ films have thicknesses of 50 nm and 150 nm, respectively. Particularly, the $IrO_2$ film preferably has a thickness between 70 nm and 250 nm.

The capacitive insulating film 9 is made of $SrBi_2(Ta_{1+x}Nb_x)O_9$ with a bismuth layered perovskite structure and covers the lower electrode 8. The thickness of the capacitive insulating film 9 is preferably between 50 nm and 200 nm.

The upper electrode 12 has a multilayer structure including Pt and Ti films stacked in this order and is deposited so as to cover the upper surface of the capacitive insulating film 9 at least partially. The Ti and Pt films have thicknesses of 20 nm and 50 nm, respectively. Alternatively, the upper electrode 12 may have a multilayer structure including TiN and Pt films instead.

In the memory cell 10 of this embodiment, the MIS transistor 1 and memory cell capacitor 2 are connected together via a contact plug 11 that passes through the passivation film 5 to reach the drain region 3b and to make electrical contact with the lower electrode 8. The contact plug 11 may be made of tungsten, polysilicon or the like.

Figure 2A:
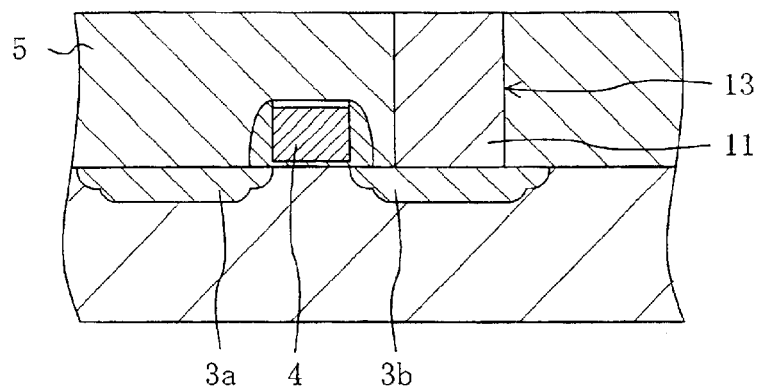
FIGS. 2A through 2C are cross-sectional views illustrating respective process steps for fabricating the memory device of the first embodiment.
Figure 2B:
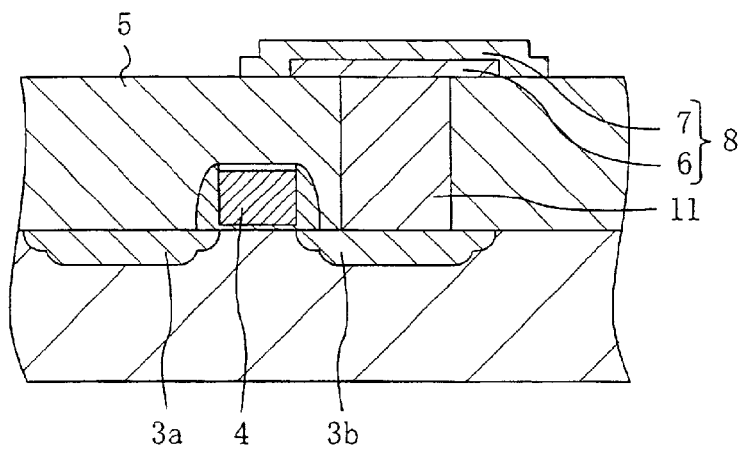
Figure 2C:
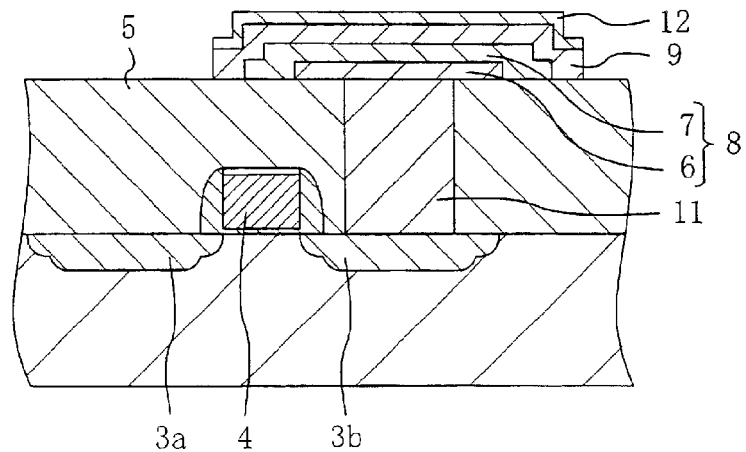

Hereinafter, a method for fabricating the semiconductor memory device of the first embodiment will be described with reference to FIGS. 2A through 2C. FIGS. 2A through 2C are cross-sectional views illustrating respective process steps for fabricating the semiconductor memory device of the first embodiment.

First, in the process step shown in FIG. 2A, an MIS transistor 1, made up of source and drain regions 3a and 3b and a gate electrode 4, is formed on a substrate. And a passivation film 5 is deposited so as to cover the entire surface of the substrate. Then, a contact hole 13, passing through the passivation film 5 to reach the drain region 3b of the MIS transistor 1, is formed by a dry etching process. Next, tungsten or polysilicon is filled into the contact hole 13 by performing a CVD process and an etchback or CMP process in combination, thereby forming a contact plug 11.

Subsequently, in the process step shown in FIG. 2B, a multilayer structure is defined over the substrate by a sputtering process. The multilayer structure includes Ti, TiAlN and Ir films stacked in this order. Then, the multilayer structure is patterned by a dry etching process so as to cover the contact plug 11, thereby forming a first barrier film 6. Next, another multilayer structure is defined by a sputtering process so as to cover the surface of the passivation film 5 and the upper and side faces of the first barrier film 6. The multilayer structure includes $IrO_2$ and Pt films stacked in this order. Then, the $IrO_2$/Pt multilayer structure is patterned by a dry etching process so as not to expose the first barrier film 6, thereby forming a second barrier film 7. By carrying out these process steps, a lower electrode 8, made up of the first and second barrier films 6 and 7, is formed.

Subsequently, in the process step shown in FIG. 2c, a capacitive insulating film 9 is deposited over the passivation film 5 and lower electrode 8 by an MOD (metal organic decomposition), MOCVD (metalorganic chemical vapor deposition) or sputtering process. The capacitive insulating film 9 is an $SrBi_2(Ta_{1-y}Nb_x)O_9$ thin film with a bismuth layered perovskite structure. Further, a multilayer structure including Pt and Ti films or Pt and TiN films stacked in this order is formed over the capacitive insulating film 9 by a sputtering process. Thereafter, the capacitive insulating film 9 and the multilayer structure are patterned by a dry etching process. As a result, an upper electrode 12 is formed.

By carrying out these process steps, a memory cell capacitor 2 for storing data thereon, including the lower and upper electrodes 8 and 12 and capacitive insulating film 9, is completed.

Hereinafter, the characteristic of a known semiconductor memory device will be compared with that of the semiconductor memory device of this embodiment.

Figure 3:
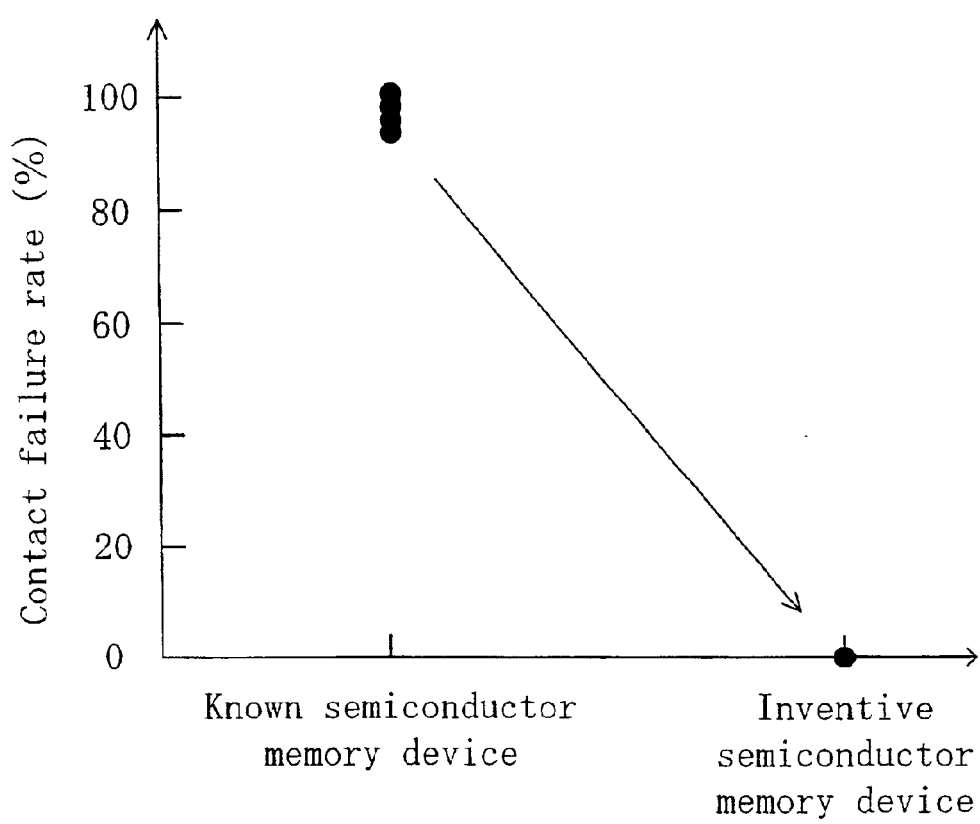
FIG. 3 is a graph illustrating an electrical characteristic of the inventive memory device.

FIG. 3 is a graph showing the contact failure rates at the contact plug of the known and inventive memory devices in comparison. As shown in FIG. 3, where an annealing process is performed at 700° C. within an oxygen ambient for an hour in order to grow ferroelectric crystals, the contact failure rate of the known memory device is 97%. In contrast, the contact failure rate of the memory device of this embodiment is 0%. This shows that remarkable effects are obtained by the present invention. That is to say, according to the present invention, the yield of semiconductor memory devices can be increased tremendously.

Figure 4:
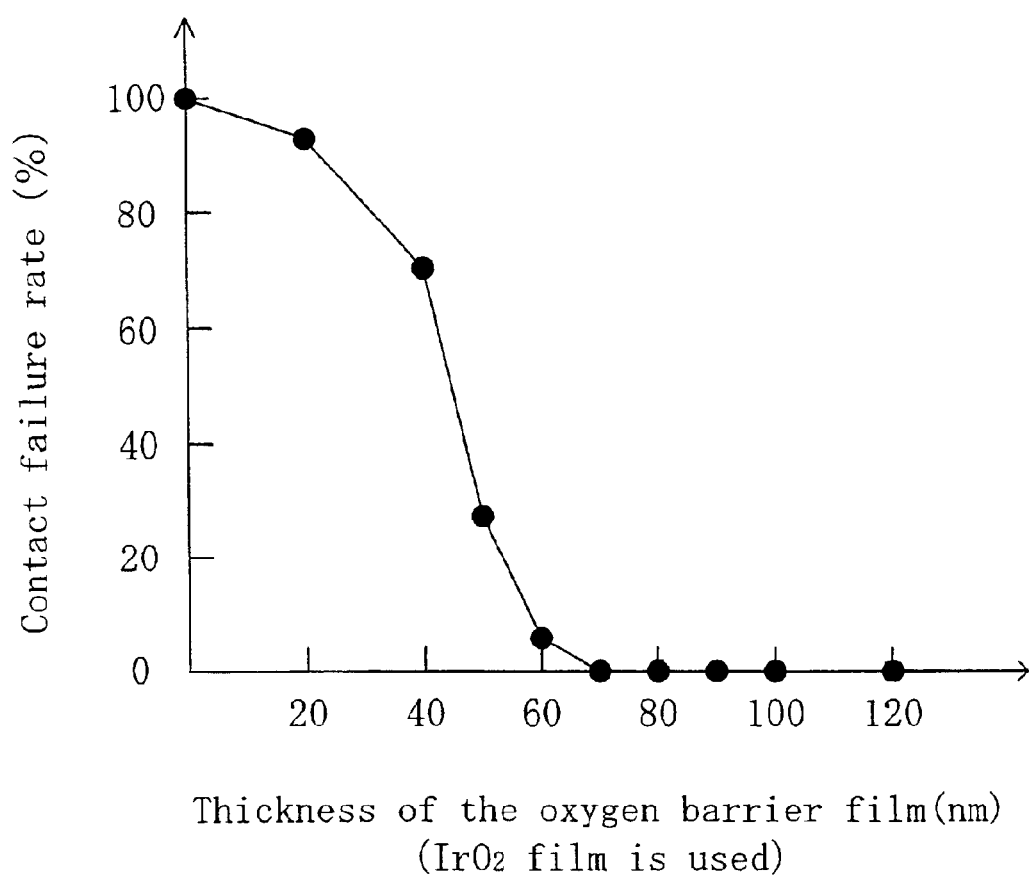
FIG. 4 is a graph illustrating a relationship between the thickness of an oxygen barrier film and a contact failure rate in the inventive memory device according to the first or second embodiment.

A relationship between the thickness of an oxygen barrier film in the second barrier film 7 and the contact failure rate in the memory device of this embodiment is shown in FIG. 4. An $IrO_2$ film is used as the oxygen barrier film of this embodiment. As shown in FIG. 4, if the $IrO_2$ film has a thickness of 70 nm or more, the contact failure rate is 0%. This shows that the diffusion of oxygen is completely prevented. However, if the $IrO$, film has a thickness of 250 nm or more, it is hard to pattern the $IrO_2$ film into a desired shape by a dry etching process. Therefore, the thickness of the $IrO_2$ film is preferably between 70 nm and 250 nm.

As can be seen from these results, in the memory device of the first embodiment, the contact failure rate can be reduced dramatically. This is because the memory device of the first embodiment includes the lower electrode 8, in which the first barrier film 6, containing a Ti or Ta compound, is covered completely with the second barrier film 7 including an oxygen barrier film. Thus, even if an annealing process is performed within an oxygen ambient to grow ferroelectric crystals when a ferroelectric film is deposited as the capacitive insulating film 9, the diffusion of oxygen into the lower electrode 8 through its side faces can be suppressed and therefore the contact plug 11 is not oxidized. In this embodiment, a ferroelectric film is formed as the capacitive insulating film 9, but the same effects are also obtainable even if a high-dielectric-constant film is formed as the capacitive insulating film 9.

In this embodiment, a multilayer structure including Ti, TiAlN and Ir films stacked in this order is used as the first barrier film 6. Alternatively, the Ir film may be omitted or a multilayer structure including Ti, TiAlN, Ir and $IrO_2$ films stacked in this order may also be used instead. In either case, the same effects can be obtained. Also, the same effects are attainable if a film selected from the group consisting of TiN, TiAlN, TiSiN, TaN, TaSiN and TaAlN films is used instead of TiAlN and Ti films. Optionally, the multilayer structure may be made up of an upper film, selected from the group consisting of TiN, TiAlN, TiSiN, TaN, TaSiN and TaAlN films, and a lower film made of Ti or Ta because the same effects are also obtainable. In other words, the first barrier film 6 preferably includes a film that can prevent a constituent element of the contact plug 11 from diffusing into the capacitive insulating film 9 (e.g., TiN, TiAlN, TiSiN, TaN, TaSiN or TaAlN film). In that case, it is possible to prevent the degradation in property of the capacitive insulating film 9.

Furthermore, in this embodiment, a multilayer structure including $IrO_2$ and Pt films stacked in this order is used as the second barrier film 7. Alternatively, the $IrO_2$ film may be used as the second barrier film 7. Optionally, a multilayer structure including $IrO_2$ and Ir films or $IrO_2$, Ir and Pt films stacked in this order may be used. In any of these cases, the same effects are obtained. In other words, the second barrier film 7 preferably includes at least one film that can prevent the diffusion of oxygen.

Moreover, in this embodiment, an $SrBi_2(Ta_{1-x}Nb_x)O_9$ film is used as the capacitive insulating film 9. Alternatively, any other ferroelectric film with a bismuth layered perovskite structure, such as a lead zirconate titanate (PZT), barium strontium titanate (BST) or tantalum pentoxide film, may also be used because the same effects are also obtainable in that case.

Embodiment 2

Figure 5:
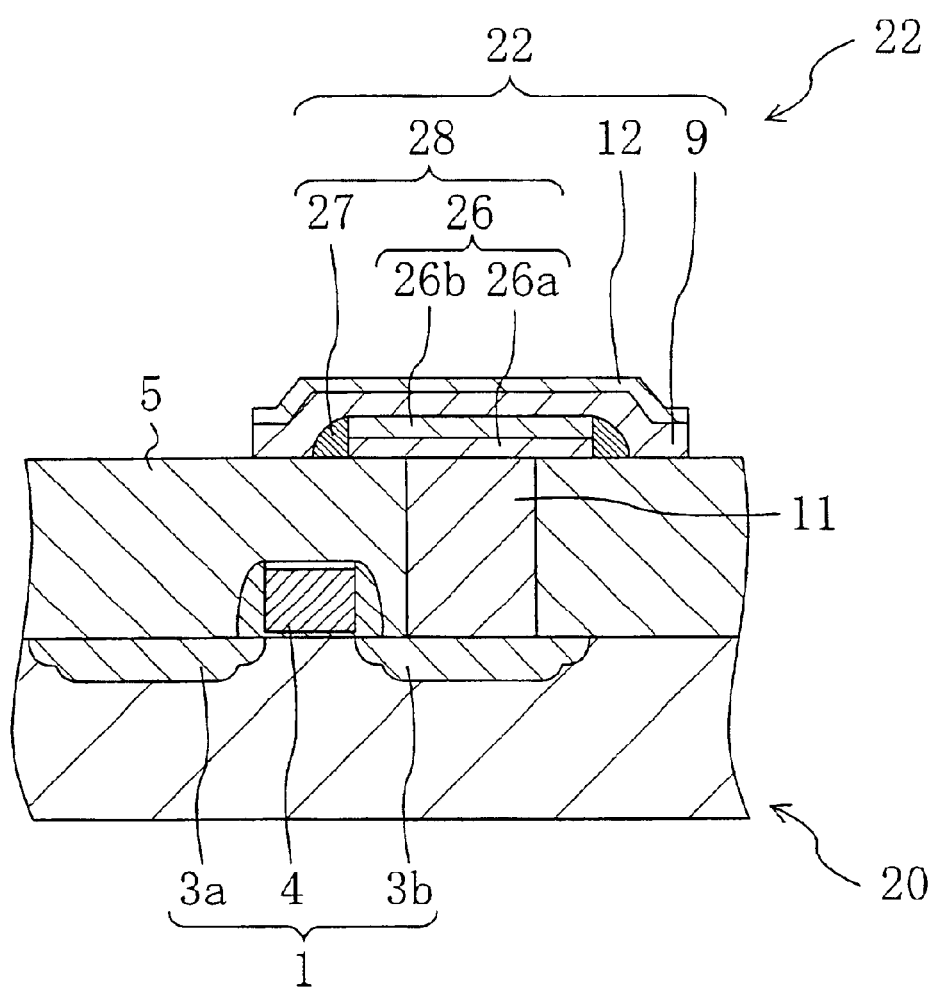
FIG. 5 is a cross-sectional view illustrating a memory cell for a semiconductor memory device according to a second embodiment of the present invention.

FIG. 5 is a cross-sectional view illustrating a memory cell 20 for a semiconductor memory device according to a second embodiment of the present invention.

As shown in FIG. 5, a memory cell 20 is implemented by integrating an MIS transistor 1 and a memory cell capacitor 22 together on a substrate. Source and drain regions 3a and 3b and a gate electrode 4 are formed around a semiconductor substrate, thus making up the MIS transistor 1. Further, a passivation film 5 is deposited over the substrate.

The memory cell capacitor 22 is made up of lower and upper electrodes 28 and 12 and a capacitive insulating film 9 interposed between the electrodes 28 and 12. The lower electrode 28 consists of first and second barrier films 26 and 27.

The first barrier film 26 is made up of a multilayer structure 26a or first film of the lower electrode, including Ti and TiAlN films stacked in this order, and another multilayer structure 26b or the second film of the lower electrode, including Ir, $IrO_2$ and Pt films stacked in this order. The Pt, $IrO_2$, Ir, TiAlN and Ti films have thicknesses of 50 nm, 80 nm, 100 nm, 40 nm and 20 nm, respectively.

The second barrier film or third film of the lower electrode 27 is made of $IrO_2$ and is deposited so as to cover the side faces of the first barrier film 26 completely. The $IrO_2$, film has a thickness of 150 nm. Particularly, the $IrO_2$ film preferably has a thickness between 70 nm and 250 nm.

The capacitive insulating film 9 is made of $SrBi_2(Ta_{1-x}Nb_x)O_9$ with a bismuth layered perovskite structure and covers the lower electrode 28. The thickness of the capacitive insulating film 9 is preferably between 50 nm and 200 nm.

The upper electrode 12 has a multilayer structure including Pt and Ti films stacked in this order and is deposited so as to cover the upper surface of the capacitive insulating film 9 at least partially. The Ti and Pt films have thicknesses of 20 nm and 50 nm, respectively. Alternatively, the upper electrode 12 may have a multilayer structure including TiN and Pt films instead.

In the memory cell 20 of this embodiment, the MIS transistor 1 and memory cell capacitor 22 are connected together via a contact plug 11 that passes through the passivation film 5 to reach the drain region 3b and to make electrical contact with the lower electrode 28. The contact plug 11 may be made of tungsten or polysilicon.

Figure 6A:
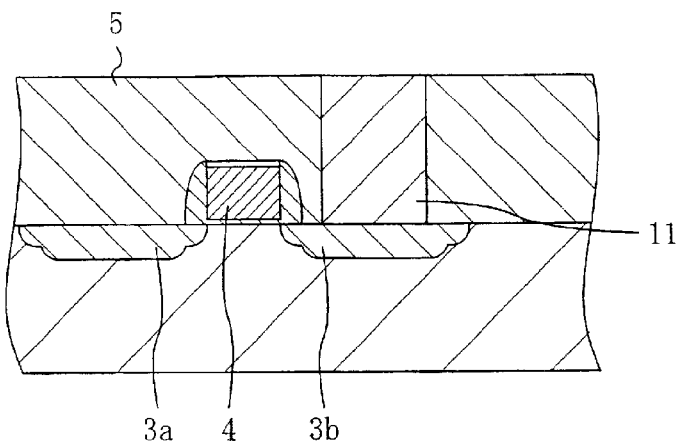
FIGS. 6A through 6C are cross-sectional views illustrating respective process steps for fabricating the memory device of the second embodiment.
Figure 6B:
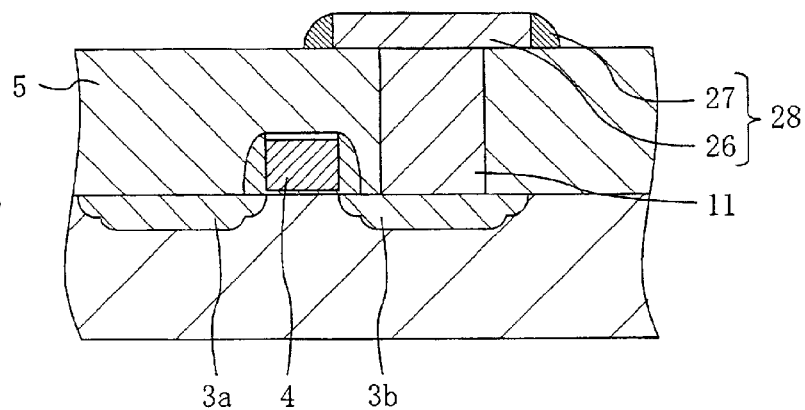
Figure 6C:
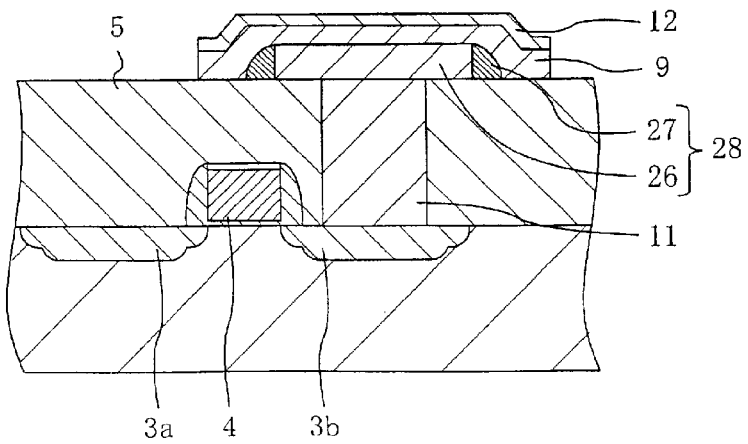
Figure 7:
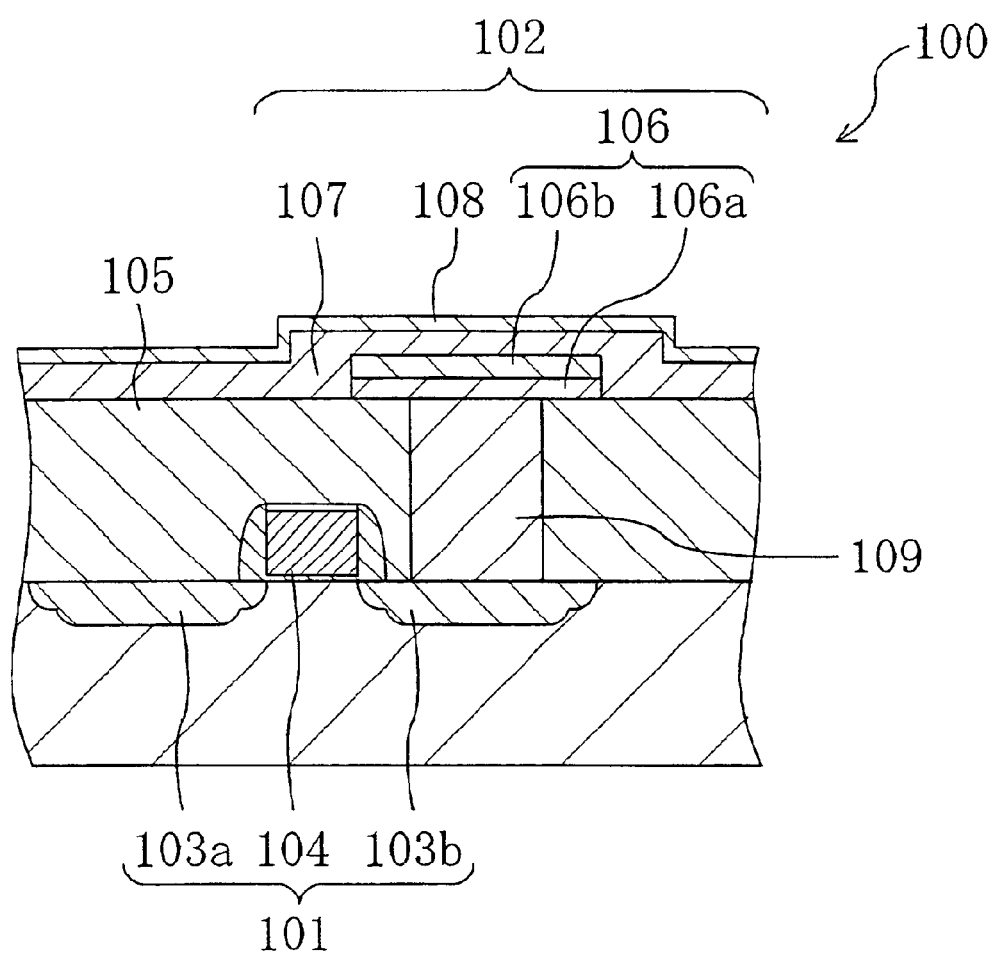
FIG. 7 is a cross-sectional view illustrating a memory cell for a known semiconductor memory device.

Hereinafter, a method for fabricating the semiconductor memory device of this embodiment will be described with reference to FIGS. 6A through 6C. FIGS. 6A through 6C are cross-sectional views illustrating respective process steps for fabricating the semiconductor memory device of this embodiment.

First, in the process step shown in FIG. 6A, an MIS transistor 1, made up of source and drain regions 3a and 3b and a gate electrode 4, is formed on a substrate. And a passivation film 5 is deposited so as to cover the entire surface of the substrate. Then, a contact hole 13, passing through the passivation film 5 to reach the drain region 3b of the MIS transistor 1, is formed by a dry etching process. Next, tungsten or polysilicon is filled into the contact hole 13 by performing a CVD process and an etchback or CMP process in combination, thereby forming a contact plug 11.

Subsequently, in the process step shown in FIG. 6B, a multilayer structure is defined over the substrate by a sputtering process. The multilayer structure includes Ti, TiAlN, Ir, $IrO_2$ and Pt films stacked in this order. Then, the multilayer structure is patterned by a dry etching process so as to cover the contact plug 11, thereby forming a first barrier film 26. Next, an $IrO_2$ film is formed by a sputtering process so as to cover the surface of the passivation film 5 and the upper and side faces of the first barrier film 26. Then, the $IrO_2$ film is patterned by a dry etching process so as not to expose the side faces of the first barrier film 26, thereby forming a second barrier film 27. By carrying out these process steps, a lower electrode 28, made up of the first and second barrier films 26 and 27, is formed.

Subsequently, in the process step shown in FIG. 6C, a capacitive insulating film 9 is deposited over the passivation film 5 and lower electrode 28 by an MOD, MOCVD or sputtering process. The capacitive insulating film 9 is an $SrBi_2(Ta_{1-x}Nb_x)O_9$ thin film with a bismuth layered perovskite structure. Further, a multilayer structure including Pt and Ti films or Pt and TiN films stacked in this order is formed over the capacitive insulating film 9 by a sputtering process. Thereafter, the capacitive insulating film 9 and the multilayer structure are patterned by a dry etching process. As a result, an upper electrode 12 is formed.

By carrying out these process steps, a memory cell capacitor pacitor 22 for storing data thereon, including the lower and upper electrodes 28 and 12 and capacitive insulating film 9, is completed.

As in the memory device of the first embodiment, the memory device of this embodiment can also obtain remarkable effects compared to a known semiconductor memory device. Specifically, even if an annealing process is performed at 700° C. within an oxygen ambient for an hour in order to grow ferroelectric crystals, the contact failure rate is also 0% as shown in FIG. 3. That is to say, according to this embodiment, the yield of semiconductor memory devices can be increased tremendously.

Like the second barrier film 7 of the first embodiment, a relationship between the thickness of the second barrier film 27 as an oxygen barrier film and the contact failure rate in the memory device of this embodiment is as shown in FIG. 4. An $IrO_2$ film is used as the oxygen barrier film of this embodiment. As shown in FIG. 4, if the IrO, film has a thickness of 70 nm or more, the contact failure rate is 0%. This shows that the diffusion of oxygen is completely prevented. However, if the $IrO_2$ film has a thickness of 250 nm or more, it is hard to pattern the $IrO_2$ film into a desired shape by a dry etching process. Therefore, the thickness of the $IrO_2$ film is preferably between 70 nm and 250 nm.

As can be seen from these results, in the memory device of this embodiment, the contact failure rate can be reduced dramatically. This is because the memory device of this embodiment includes the lower electrode 28, in which the side faces of the multilayer structure 26a, containing at least a Ti or Ta compound, in the first barrier film 26 is covered with the second barrier film 27 as an oxygen barrier film. Thus, even if an annealing process is performed within an oxygen ambient to grow ferroelectric crystals when a ferroelectric film is deposited as the capacitive insulating film 9, the diffusion of oxygen into the lower electrode 28 through its side faces can be suppressed and therefore the contact plug 11 is not oxidized. In this embodiment, a ferroelectric film is formed as the capacitive insulating film 9, but the same effects are also obtainable even if a high-dielectric-constant film is formed as the capacitive insulating film 9.

In this embodiment, the multilayer structure 26a, including Ti and TiAlN films stacked in this order, and the multilayer structure 26b, including Ir, $IrO_2$ and Pt films stacked in this order, are used to make up the first barrier film 26. Alternatively, an Ir film may be used instead of the multilayer structure 26b. Optionally, a multilayer structure including Ir and $IrO_2$ films or Ir and Pt films stacked in this order may also be used as the multilayer structure 26b because the same effects can be obtained. Alternatively, a film, selected from the group consisting of TiN, TiAlN, TiSiN, TaN, TaSiN and TaAlN films, may be used instead of the multilayer structure 26a. A multilayer structure, made up of an upper film selected from the group consisting of TiN, TiAlN, TiSiN, TaN, TaSiN and TaAlN films and a lower film made of Ti or Ta, may also be used as the multilayer structure 26a. The same effects are also attainable in any of these cases. In other words, the first barrier film 26 preferably includes a film that can prevent a constituent element of the contact plug 11 from diffusing into the capacitive insulating film 9 (e.g., TiN, TiAlN, TiSiN, TaN, TaSiN or TaAlN film). In that case, it is possible to prevent the degradation in property of the capacitive insulating film 9

Furthermore, in this embodiment, an $IrO_2$ film is used as the second barrier film 27. Alternatively, a multilayer structure including $IrO_2$ and Ir films, $IrO_2$ and Pt films or $IrO_2$, Ir and Pt films stacked in this order may be used because the same effects are obtainable in any of these cases. In other words, the second barrier film 27 preferably includes a film that can prevent the diffusion of oxygen.

Moreover, in this embodiment, an $SrBi_2(Ta_{1-x}Nb_x)O_9$ film is used as the capacitive insulating film 9. Alternatively, any other ferroelectric film with a bismuth layered perovskite structure, such as a lead zirconate titanate, barium strontium titanate or tantalum pentoxide film, may also be used. In any of these cases, the same effects are also attainable.

What is claimed is:

1. A semiconductor memory device comprising a memory cell capacitor for storing data thereon, the capacitor being made up of a lower electrode connected to a contact plug,
    an upper electrode and a capacitive insulating film interposed between the lower and upper electrodes,
    wherein the lower electrode includes a first film of the lower electrode in contact with the contact plug and a second film of the lower electrode, which is formed on the first film of the lower electrode and prevents the diffusion of oxygen,
    wherein the second film of the lower electrode covers the upper and side faces of the first film of the lower electrode
    wherein a thickness of the second film of the lower electrode is between 70 nm and 250 nm.

2. The memory device of claim 1, wherein the first film of the lower electrode includes a film that prevents a constituent element of the contact plug from diffusing into the capacitive insulating film.

3. The memory device of claim 2, wherein the first film of the lower electrode includes a film one or more films selected from the group consisting of TiN, TiAlN, TiSiN, TaN, TaSiN, TaAlN Ti and Ta films.

4. The memory device of claim 2, wherein the second film of the lower electrode includes an Ir or $IrO_2$ film.

5. A semiconductor memory device comprising a memory cell capacitor for storing data thereon, the capacitor being made up of a lower electrode connected to a contact plug, an upper electrode and a capacitive insulating film interposed between the lower and upper electrodes, wherein the lower electrode includes a first film of the lower electrode in contact with the contact with the contact plug, a film second film of the lower electrode covering the upper surface of the first film of the lower electrode and a third film of the lower electrode covering the side faces of the first film of the lower electrode, wherein the second and third films of the lower electrode prevent the diffusion of oxygen, and wherein a thickness of the second film of the lower electrode is between 70 nm and 250 nm.

6. The memory device of claim 5, wherein the first first film of the lower electrode includes a film that prevents a constituent element of the contact plug from diffusing into the capacitive insulating film.

7. The memory device of claim 6, wherein the first film of the lower electrode includes one or more films selected from the group consisting of TiN, TiAlN, TiSiN, TaN, TaSiN, TaAlN Ti and Ta films.

8. The memory device of claim 6 wherein each of the second and third films of the lower electrode includes an Ir or $IrO_2$ film.

* * * * *

UNITED STATES PATENT AND TRADEMARK OFFICE
CERTIFICATE OF CORRECTION

PATENT NO. : 6,847,074 B2
APPLICATION NO. : 09/785502
DATED : January 25, 2005
INVENTOR(S) : Yoshihisa Nagano et al.

It is certified that error appears in the above-identified patent and that said Letters Patent is hereby corrected as shown below:

Column 8, line 67, "TaA1N Ti" should read --TaA1N, Ti.--

Column 9, line 9, "electrode in contact with the contact with the contact plug" should read --electrode in contact with the contact plug.--

Column 9, line 10, "plug, a film second film" should read --plug, *a* second film.--

Column 10, line 3, "the first first film" should read --the first film.--

Column 10, line 10, "TaA1N Ti" should read --TaA1N, Ti.--

Column 10, line 11, "claim 6 wherein" should read --claim 6, wherein.--

Signed and Sealed this

Seventeenth Day of October, 2006

JON W. DUDAS
*Director of the United States Patent and Trademark Office*